United States Patent
Goto

(10) Patent No.: US 7,816,903 B2
(45) Date of Patent: Oct. 19, 2010

(54) SINGLE-PHASE 3-WIRE POWER LINE CONNECTION DETERMINATION APPARATUS AND CONNECTION DETERMINATION METHOD

(75) Inventor: Koki Goto, Kanagawa-ken (JP)

(73) Assignee: SMK Corporation, Tokyo (JP)

( * ) Notice: Subject to any disclaimer, the term of this patent is extended or adjusted under 35 U.S.C. 154(b) by 215 days.

(21) Appl. No.: 12/052,841

(22) Filed: Mar. 21, 2008

(65) Prior Publication Data

US 2009/0237115 A1   Sep. 24, 2009

(51) Int. Cl.
G01R 19/00 (2006.01)
G01R 25/00 (2006.01)

(52) U.S. Cl. .............................. 324/66; 324/67; 324/86

(58) Field of Classification Search ................... 324/66, 324/67, 86; 702/72
See application file for complete search history.

(56) References Cited

U.S. PATENT DOCUMENTS

| | | | | |
|---|---|---|---|---|
| 5,510,700 A | * | 4/1996 | Pomatto | 324/66 |
| 5,521,491 A | * | 5/1996 | Najam | 324/86 |
| 7,031,859 B2 | * | 4/2006 | Piesinger | 702/72 |
| 7,141,960 B2 | * | 11/2006 | Bystrom | 324/66 |
| 7,221,140 B2 | * | 5/2007 | Fu et al. | 324/86 |
| 7,598,720 B2 | * | 10/2009 | Veroni et al. | 324/66 |
| 7,612,552 B2 | * | 11/2009 | Dent | 324/86 |
| 2004/0131113 A1 | * | 7/2004 | Rao | 375/226 |
| 2008/0164862 A1 | * | 7/2008 | Tazzari et al. | 324/86 |

FOREIGN PATENT DOCUMENTS

JP          2050633          2/1990

* cited by examiner

*Primary Examiner*—Timothy J Dole
*Assistant Examiner*—John Zhu
(74) *Attorney, Agent, or Firm*—Edwards Angell Palmer & Dodge LLP

(57) ABSTRACT

In a method for determining whether multiple power outlets in a 3-wire power line connection are connected to a same outer wire (P1 or P2), the hot terminal of a first power outlet is identified and a first zero cross time of the hot terminal to which AC voltage is applied is detected. The hot terminal of a second power outlet is identified, and second zero cross time of the hot terminal to which AC voltage is applied is detected. It is determined that the first power outlet and the second power outlet are connected to the same power line if the time elapsed ΔT from the first zero cross time of the first power outlet to the second zero cross time of the second power outlet is an integral multiple of the AC voltage cycle.

6 Claims, 3 Drawing Sheets

| Outlet | Voltage waveform | Hot terminal | The elapsed time (ΔT) from the zero cross time ($t_A$) of outlet A  n is a positive integer | Determination of whether the outlet is connected to the same power line as that of A |
|---|---|---|---|---|
| A (Standard) |  | R | 0 | - |
| B |  | R | $t_B - t_A = nT$ | OK |
| C |  | L | $t_C - t_A = nT$ | OK |
| D |  | L | $t_D - t_A = nT \pm T/2$ | NG |
| E |  | R | $t_E - t_A = nT \pm T/2$ | NG |

SINGLE-PHASE 3-WIRE POWER LINE CONNECTION DETERMINATION APPARATUS AND CONNECTION DETERMINATION METHOD

FIELD OF THE INVENTION

The present invention relates to a single-phase 3-wire power line connection determination apparatus and connection determination method that determines whether or not 2 power outlets connected to a single-phase 3-wire power line are connected to in-phase power wires, and more specifically, relates to a single-phase 3-wire power line connection determination apparatus and connection determination method that determines whether or not the hot terminals of 2 power outlets are connected to the same outer wires P1, P2 of the single-phase 3-wire power line.

BACKGROUND OF THE INVENTION

Domestic electrical appliances include both general electrical devices that use a 100 VAC power source, such as lighting fixtures, refrigerators, and TV receivers, as well as appliances that consume more electricity and are designed for a 200 VAC power source, such as air conditioning. A single-phase 3-wire power distribution system that distributes power through common power wires has generally been adopted for these appliances.

As indicated in FIG. 4, this power distribution system uses a pole transformer, which is a power distribution transformer 102, to drop the voltage of a 6600 V high voltage power line 101, and commercial power line, comprising neutral wire N and outer wires P1 and P2, is wired into the building. The neutral wire N is drawn from the middle tap of the secondary coil of the power distribution transformer 102, and outer wires P1 and P2 are drawn from the two edges of the secondary coil. The neutral wire N is generally grounded, and 100 VAC voltage is wired by using the neutral wire N and the outer wire P1 or the neutral wire N and the outer wire P2. In addition, because the potentials of the outer wire P1 and the outer wire P2 have a reverse phase relationship, 200 VAC voltage is distributed between the outer wire P1 and the outer wire P2. Consequently, if the power plug of an appliance is plugged into a power outlet 103 connected to the neutral wire N and the outer wire P1 or to the neutral wire N and the outer wire P2, 100 VAC power is obtained, and if plugged into a power outlet 104 connected to outer wires P1 and P2, then 200 VAC power is obtained.

Meanwhile, there is no particular restriction on whether the power outlet 103 that supplies 100 VAC is connected to the neutral wire N and the outer wire P1 or to the neutral wire N and the outer wire P2, specifically, there is no particular restriction on whether the hot terminal 103$p$ of the power outlet is connected to the outer wire P1 or to the outer wire P2. Moreover, in the past, because 100 VAC power is supplied in either case, there was no problem regarding this connection.

Nonetheless, recently modulation systems such as spread spectrum modulation systems have come into use, and so-called PLC (power line communication) systems that utilize power lines wired into the house to conduct communications have garnered attention; and a practical application of power line communications is to plug the power plugs of modem devices 105 into power outlets 103 that supply 100 VAC and are installed in different locations within the house, and to communicate data between terminal devices connected to the modem devices using the power line as a signal line.

In this kind of power line communications, as indicated in FIG. 4, if the hot terminal 103Ap of the transmitting power outlet 103A and the hot terminal 103Bp of the receiving power outlet 103B are respectively connected to differing outside lines P1 and P2, then the signals that arrive at the receiving terminal will be greatly attenuated, and satisfactory communications will not be maintained. For example, when superimposing a 10 dBm transmission signal on the neutral wire N and outer wire P1 and comparing to the power expressed between the neutral wire N and out-of-phase outer wire P2, in a frequency band of 10 KHz or more there is an attenuation of 30 dBm or more between out-of-phase wiring compared to between in-phase wiring, and demodulation may be become impossible if the signal power becomes −50 dBm.

Thus, in the past, there have been power line circuit selection apparatuses (for example, Japanese Unexamined Patent Application No. H2-50633, which is hereby incorporated by reference in its entirety herein) providing a switching circuit to switch either between the neutral wire N and the outer wire P1 or between the neutral wire N and the outer wire P2, a modem device, and a reception data memory; once the signals flowing between one of the distribution lines were demodulated and memorized in the reception data memory, the data was read from the reception data memory, and newly modulated signals were output to between the other set of distribution lines by using the switching circuit to switch the connection. According to this power line circuit selection apparatus, even if the hot terminals of the power outlets are between terminal devices connected to differing outer wires P1 and P2, the signals are transmitted through the power line circuit selection device, and therefore can be demodulated by the receiving terminal appliance without attenuation.

Nonetheless, the conventional method of connecting this power line circuit selection device between the distribution lines requires the use of a large and expensive device, and is ill-suited for power line communication that conducts communication by using lamp fixture wiring in the house as the signal line while maintaining the previously existing communication environment unchanged as much as possible.

If it is known whether the hot terminal of the power outlet supplying the 100 VAC is connected to the outer wire P1 or P2, then there is no problem, but that connection is not specifically restricted, and the connection status cannot be known from the outer appearance. As a result, when the first power outlet and the second power outlet are connected to differing outer wires, that misconnection cannot be ascertained from the outer appearance, and thus there is the risk that communication continues on without noticing the cause of the attenuation of transmission signal power.

If the hot terminals of a set of power outlets are connected to the same outer wire P1 or P2, the AC voltages supplied between the terminals of the power outlets will be in-phase, and if connected to differing outer wires P1 and P2, the voltages will have reverse phases. Therefore, the aforementioned problem can be resolved if the voltage waveforms of both power outlets are compared, and a set of in-phase power outlets is selected. Nonetheless, in order to simultaneously compare the potential of both, the comparison and determination device must be connected respectively to a set of power outlets, and if the set of power outlets are located separately such as on the first and second floors of the house, then using a long cable to connect the two is not practical, and the connection status cannot be easily determined.

SUMMARY OF THE INVENTION

Taking these problems of conventional systems into account, an object of the present invention is to provide a single-phase 3-wire power line connection determination apparatus and connection determination method that has a simple configuration and can determine whether a set of power outlets are connection to the same outer wires P1 and P2.

In order to achieve the objective above, a single-phase 3-wire power line connection determination apparatus in accordance with the present invention comprises:

a voltage detection circuit that detects the voltage between a ground probe terminal, which is brought into contact with a ground potential body and is at near-ground potential, and a hot probe terminal, which is brought into contact with either of a pair of terminals of a power outlet that is connected to a single-phase 3-wire power line, and that identifies the terminal at which a high potential difference has been detected as the hot terminal that is connected to either a first outer wire or a second outer wire of the single-phase 3-wire power line;

a zero cross detection circuit that compares the potential of the AC voltage of the hot probe terminal contacting the hot terminal of the power outlet with the standard potential of the ground probe terminal at near-ground potential, and that detects the zero cross time either at the rising zero cross point at which the AC voltage crosses the standard potential when rising or at the falling zero cross point at which the AC voltage crosses the standard potential when falling;

timing means that measures the time elapsed from a first zero cross time, which is detected when the hot probe terminal is brought into contact with the hot terminal of a first power outlet, to a second zero cross time, which is detected when the hot probe terminal is brought into contact with the hot terminal of a second power outlet; and a connection determination means that, if the time elapsed from the first zero cross time to the second zero cross time is an integral multiple of the cycle of the AC voltage, determines that the hot terminals of the first power outlet and the second power outlet are connected to a common first outer wire or second outer wire.

AC voltage is applied to the first outer wire or the second outer wire of the single-phase 3-wire power line, meanwhile, because the neutral wire is grounded, the terminal of the power outlet having the high potential difference when brought into contact with the hot probe terminal is identified as the hot terminal connected to either the first outer wire or the second outer wire.

If the time elapsed from the first zero cross to the second zero cross is an integral multiple of the AC voltage cycle, it can be determined that in-phase AC voltage is applied to the hot terminals of the first power outlet and the second power outlet, and that the terminals are connected to a common first outer wire or second outer wire. If the hot terminals of the first power outlet and second power outlet are connected separately to the first outer wire and second outer wire, reverse phase AC voltage is applied, and therefore the time elapsed from the first zero cross to the second zero cross will be displaced a half cycle to an integral multiple of the cycle of the AC voltage, and it is determined that the terminals are not connected to a common outer wire.

The single-phase 3-wire power line connection determination apparatus of claim 2 may further comprise a ground potential body including a metal plate supported parallel to the ground surface.

A large free capacitance is obtained between the ground surface and the metal plate supported parallel to the ground surface, and the metal plate can be assumed to have near-ground potential. Consequently, a high potential difference is generated between the hot terminal connected to either the first outer wire or second outer wire of the single-phase 3-wire power line, and this terminal can be differentiated from the other terminal having little grounded potential difference. Moreover, even in places where the ground probe terminal cannot be grounded, the standard potential can be taken as near-ground potential, and when comparing ground potential with the potential of the AC voltage of the hot probe terminal, the zero cross point can be detected with a slight margin of error.

By making the metal plate have a size and weight that can be carried, the ground probe terminal can be brought into contact with the metal plate near both the first power outlet and the second power outlet, and the metal plate can be assumed to have near-ground potential.

The timing means of the single-phase 3-wire power line connection determination apparatus may include a clock timer that converts the difference in count values of a free run counter into the time elapsed.

The free run counter counts in even time intervals, therefore, to obtain the elapsed time from the first zero cross to the second zero cross, the count time interval is multiplied by the difference in count value at the first zero cross time and the count value at the second zero cross time.

A single-phase 3-wire power line connection determination method in accordance with the present invention may be characterized by the following steps:

a ground probe terminal is brought into contact with a ground potential body near a first power outlet connected to a single-phase 3-wire power line, and near ground potential is taken as the standard potential;

the voltage is detected between the ground probe terminal taken as the standard potential and a hot probe terminal brought into contact with either of a pair of terminals of a first power outlet; and the terminal at which a high potential difference is detected is taken as the hot terminal of the first power outlet that is connected to a first outer wire or a second outer wire of the single-phase 3-wire power line, and the hot probe terminal is brought into contact with the hot terminal;

the potential of the AC voltage of the hot probe terminal contacting the hot terminal of the first power outlet is compared with the standard potential of the ground probe terminal contacting the ground potential body, and a first zero cross time is detected either at the rising zero cross point at which the AC voltage crosses the standard potential when rising or at the falling zero cross point at which the AC voltage crosses the standard potential when falling;

the first zero cross time is memorized;

the ground probe terminal is brought into contact with the ground potential body near a second power outlet that is connected to the single-phase 3-wire power line, and near ground potential is taken as the standard potential;

the voltage is detected between the ground probe terminal taken as the standard potential and the hot probe terminal brought into contact with either of a pair of terminals of the second power outlet is detected; and the terminal at which a high potential difference is taken as the hot terminal of the second power outlet that is connected to a first outer wire or a second outer wire of the single-phase 3-wire power line, and the hot probe terminal is brought into contact with the hot terminal;

the potential of the AC voltage of the hot probe terminal contacting the hot terminal of the second power outlet is compared with the standard potential of the ground probe terminal contacting the ground potential body, and a second zero cross time is detected at which the potential of the AC voltage crosses the standard potential at the same rising zero cross point or falling zero cross point as that of the first zero cross point; and if the time elapsed from the first zero cross to the second zero cross is an integral multiple of the cycle of the AC voltage, it is determined that the hot terminals of the first power outlet and the second power outlet are connected to a common first outer wire or second outer wire.

AC voltage is applied to the first outer wire or the second outer wire of the single-phase 3-wire power line, meanwhile, because the neutral wire is grounded, the terminal of the power outlet having the high potential difference when brought into contact with the hot probe terminal is identified as the hot terminal connected to either the first outer wire or the second outer wire.

If the time elapsed from the first zero cross to the second zero cross is an integral multiple of the AC voltage cycle, it can be determined that in-phase AC voltage is applied to the hot terminals of the first power outlet and the second power outlet, and that the terminals are connected to a common first outer wire or second outer wire. If the hot terminals of the first power outlet and second power outlet are connected separately to the first outer wire and second outer wire, reverse phase AC voltage is applied, and therefore the time elapsed from the first zero cross to the second zero cross will be displaced a half cycle to an integral multiple of the cycle of the AC voltage, and it is determined that the terminals are not connected to a common outer wire.

The single-phase 3-wire power line connection determination apparatus according to the present invention may comprise a ground potential body having a metal plate supported parallel to the ground surface.

A large free capacitance is obtained between the ground surface and the metal plate supported parallel to the ground surface, and the metal plate can be assumed to have near-ground potential. Consequently, a high potential difference is generated between the hot terminal connected to either the first outer wire or second outer wire of the single-phase 3-wire power line, and this terminal can be differentiated from the other terminal having little grounded potential difference. Moreover, even in places where the ground probe terminal cannot be grounded, the standard potential can be taken as near-ground potential, and when comparing ground potential with the potential of the AC voltage of the hot probe terminal, the zero cross point can be detected with a slight margin of error.

By making the metal plate have a size and weight that can be carried, the ground probe terminal can be brought into contact with the metal plate near both the first power outlet and the second power outlet, and the metal plate can be assumed to have near-ground potential.

According to the present invention, because whether or not a first power outlet and a second power outlet are connected to a common single-phase 3-wire power line is determined by comparing the potentials of the individual hot terminals of the first power outlet and the second power outlet to a standard potential, no cable needs to be run in order to simultaneously compare the phases of both, and a determination can be made even when the first power outlet and the second power outlet are located separately.

Moreover, in power line communication utilizing single-phase 3-wire power lines as the communication line, misconnection of the first power outlet and second power outlet, for which the state of connection can not be easily ascertained from the outer appearance, can be easily detected just by attenuation of the signal power of the transmission signal, and a second power outlet that is connected to the same power wire as the first power outlet can be selected, making power line communication possible without signal power attenuation.

Moreover, the connection of the first power outlet and the second power outlet can be determined by a simple device comprising just a voltage detection circuit, a zero cross detection circuit, a timing means, and a connection determination means.

In addition, in embodiments of the invention a ground potential body having a metal plate, even when the first power outlet and the second power outlet are set up in separate locations, the metal plate is carried nearby, and the ground probe terminal can be readily taken as near-ground potential.

When determining the hot terminal of the power outlet and detecting the zero cross time, the ground probe terminal is kept in contact with the same metal plate, and can be taken as near-ground potential.

According an embodiment of the present invention, the time elapsed is obtained just by a free run counter and a simple calculation circuit without providing a memory circuit to memorize the first zero cross time and the second zero cross time.

BRIEF DESCRIPTION OF THE DRAWINGS

The invention will become more readily apparent from the Detailed Description of the Invention, which proceeds with reference to the drawings in which.

DETAILED DESCRIPTION OF THE INVENTION

Figure 1:
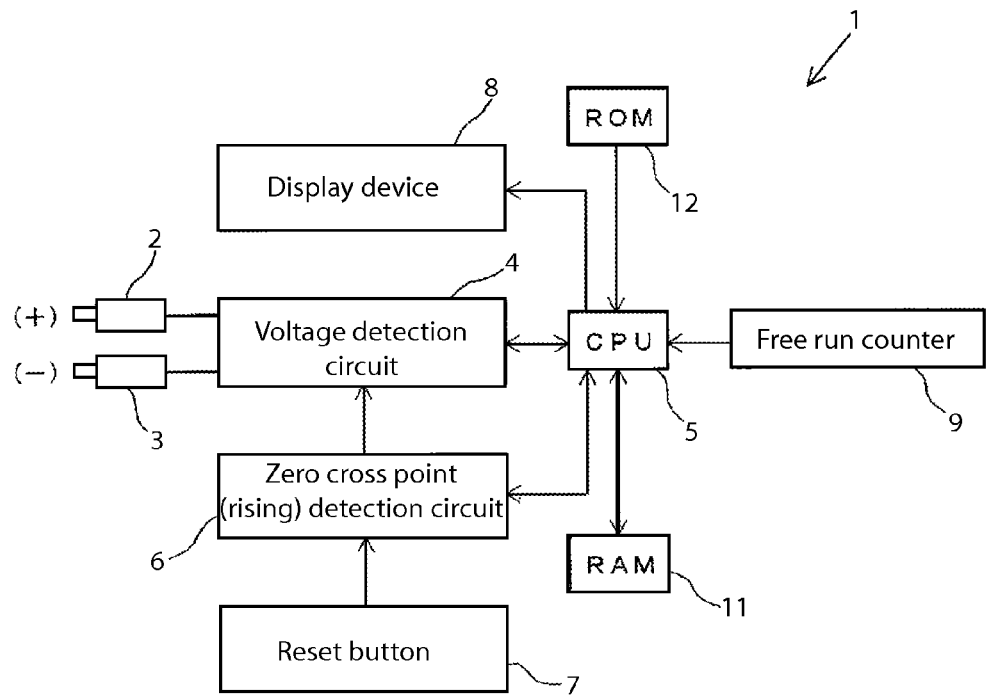
FIG. 1 is a block diagram of a connection determination apparatus 1 representing an embodiment of the present invention.

The following table provides a key to the reference numerals and elements depicted in the drawings.

| | |
|---|---|
| 1 | Connection determination apparatus |
| 2 | Hot probe terminal |
| 3 | Ground probe terminal |
| 4 | Voltage detection circuit |
| 5 | CPU (timing means, connection determination circuit) |
| 6 | Zero cross point detection circuit (zero cross detection circuit) |
| 10 | Single-phase 3-wire power line |
| N | Neutral wire |
| P1 | First outer wire |
| P2 | Second outer wire |

Figure 2:
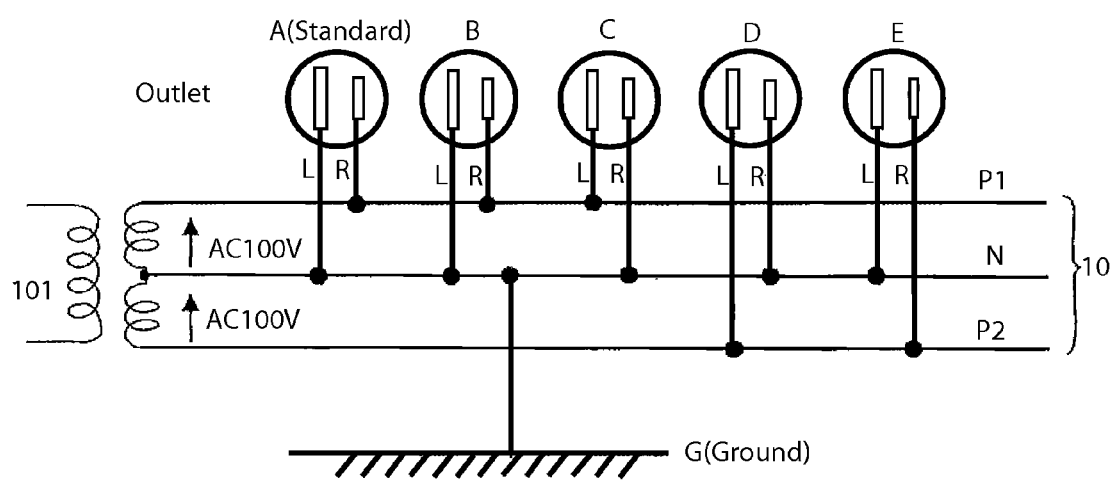
FIG. 2 is a power wiring diagram indicating the status of a first power outlet A and four second power outlets B through E connected to a single-phase 3-wire power line 10.
Figure 3:
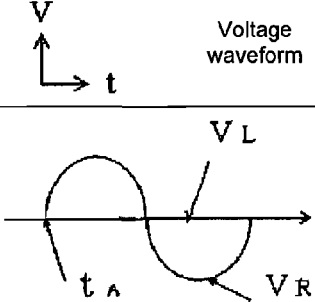
FIG. 3 is an explanatory diagram indicating the method of determining the various states of connection of the second power outlets B through E in relation to the first power outlet A.
Figure 3:
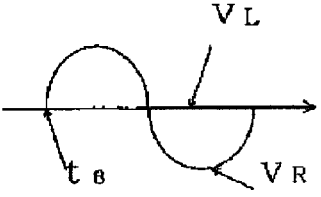
Figure 3:
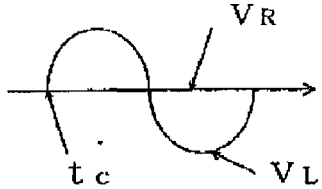
Figure 3:
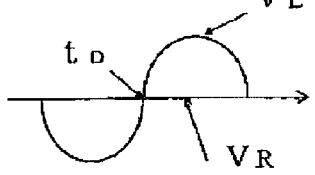
Figure 3:
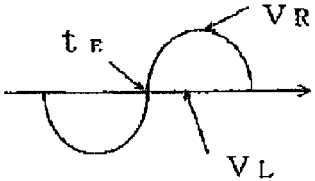
Figure 4:
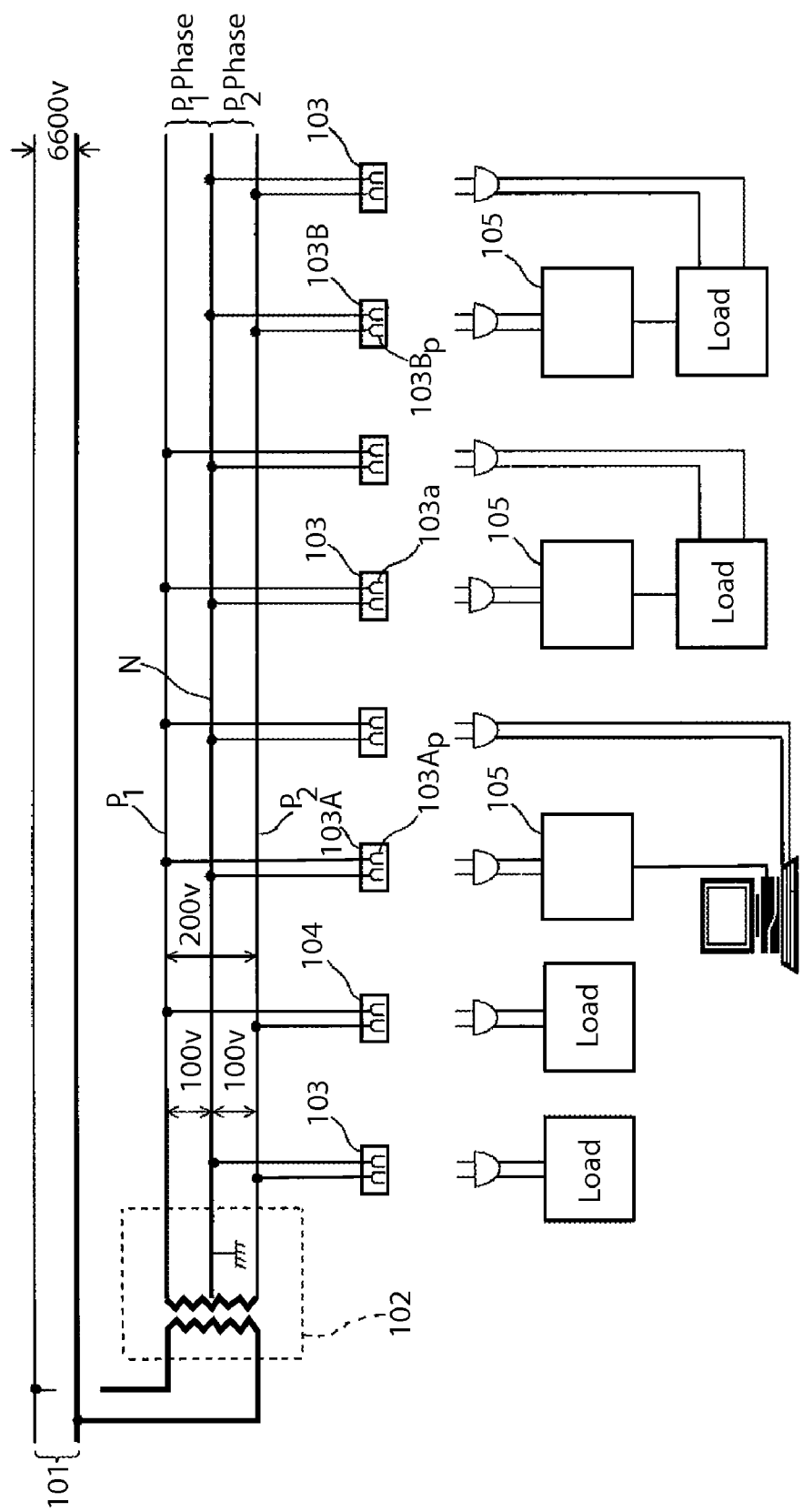
FIG. 4 is a wiring diagram indicating a single-phase 3-wire power distribution system.

The single-phase 3-wire power line connection determination apparatus 1 and connection determination method related to one form of embodying the present invention will be explained below using FIGS. 1 to 3. FIG. 1 is a block diagram of a connection determination apparatus 1; FIG. 2 is a power wiring diagram indicating the status of a first power outlet A and four second power outlets B through E connected to a single-phase 3-wire power line 10; and FIG. 3 is an explanatory diagram indicating the method of determining the various states of connection of the second power outlets B through E in relation to the first power outlet A.

As indicated in FIG. 1, the connection determination apparatus 1 comprises a hot probe terminal 2, a ground probe terminal 3, and a voltage detection circuit 4 that detects the voltage between this pair of probe terminals 2 and 3. The voltage detected by the voltage detection circuit 4 is the difference in potential of the hot probe terminal 2 in relation to the standard voltage when taking the potential of the ground probe terminal 3 as the standard potential, and this voltage is continually output to a CPU 5, which is connected to the output side of the voltage detection circuit 4, and to a zero cross point detection circuit 6.

When a reset signal is input by manipulating a reset button 7, the zero cross point detection circuit 6 generates a timing signal for timing the rising zero cross point at which the voltage detected between the probe terminals 2 and 3 input from the voltage detection circuit 4 turns from negative to positive, specifically, for timing when the potential of hot probe terminal 2 rises and exceeds the standard potential of the ground probe terminal 3, and the timing signals are output to the CPU 5, which is connected to the output side of the circuit 6.

In addition to these circuits 4 and 6, the CPU 5 is connected to a display device 8, a free run counter 9, a RAM 11 and a ROM 12; and the CPU 5 includes a timing means to measure the time elapsed $\Delta T$ from a first zero cross time to a second zero cross time, which will be described later, and a connection determination means to determine the connection status between the first power outlet and the second power outlet. Controlled by the CPU 5, the display device 8 displays the voltage that the voltage detection circuit 4 has detected, and the connection status determination results from the connection determination means of the CPU 5.

The free run counter 9 is a device that divides the frequency of a clock signal transmitted from a clock (not shown), and repeats a count at a specified frequency clearly higher than the AC frequency running in the single-phase 3-wire power line 10 (for example, 50 Hz or 60 Hz). When the timing signal that expresses the initial rising zero cross point is input from the zero cross point detection circuit 6, the CPU 5 places the count value input from the free run counter 9 in the memory of RAM 11 as the initial count value. Continuing, every time a timing signal expressing the rising zero cross point is input from the zero cross point detection circuit 6, the count value input from the free run counter 9 at the time of input is memorized in RAM 11 as the second count value, third count value, etc. in the order of input, and this is repeated until the operation of the entire connection determination apparatus 1 is reset such as by turning off the connection determination apparatus 1. Regarding the second count value, third count value, etc., the count value expresses the time of the second zero cross detected from the second power outlet, and so on, in order to compare the time elapsed with the time of the first zero cross. The CPU, which is the timing means, calculates the time elapsed $\Delta T$ from the first zero cross time to the second zero cross time by multiplying the count cycle of the free run counter by the value derived by subtracting the first count value from the second count value.

The CPU 5 compares this calculated time elapsed $\Delta T$ with the cycle of the AC voltage running in the single-phase 3-wire power line 10 (for example, if the AC frequency is 50 Hz, 20 msec), and if the elapsed time $\Delta T$ is an integral multiple of the AC voltage, the CPU 5 determines that the connection between the power outlets is with the same power wire and displays OK on the display device 8; and if the time is not an integral multiple, determines that the connection is with different power wires, and displays NG.

Further, the ROM 12 is a device that stores the boot program, the program that executes the operations of the CPU 5 described above, the data displayed on the display device 8, and the multiple cycles of the AC voltage which can possibly run in the single-phase 3-wire power line 10, and the like.

A method of determining the connection between the first power outlet A and the 4 ways of connecting the second power outlets B through E will be explained below using this connection determination apparatus 1. Here, for example, the neutral wire N and either of the outer wires P1 and P2 of the single-phase 3-wire power line 10 indicated in FIG. 2 are taken as the communication line. Which of the second power outlets B through E are connected to the same power line as that of the first power outlet A, and thus can transmit signals without attenuation of signal power between the communication apparatus connected to the first power outlet A and the communication apparatus connected to the respective second power outlet, shall be determined from the second power outlets B through E.

Initially, the ground probe terminal 3 of the connection determination apparatus 1 is brought into contact with the ground potential body near the first power outlet A, which is the standard, and is taken as the standard potential of near-ground potential. If an earth terminal connected to ground is around the power outlet, the earth terminal is desirable as the ground potential body, but if not hard wired, then the floor or wall, etc. is substituted for the earth potential body. Moreover, in the form of this example, a metal plate of a specified weight and size that can be carried, which is supported horizontally in relation to the earth and which is brought into contact with the floor or wall, etc, is used as the ground potential body. The metal plate, which is supported in this way and is brought into contact with the floor or wall, etc., obtains a larger static capacity in relation to the ground surface, and the potential of the ground probe terminal 3 brought into contact with the metal plate can be taken as near-ground potential.

With the ground probe terminal 3 brought into contact with the metal plate, the hot probe terminal 2 is alternately brought into contact with the pair of L and R terminals of the first power outlet A. When the hot probe terminal 2 is brought into contact with the L terminal of the first power outlet A, the voltage of the L terminal related to the standard potential detected by the voltage detection circuit 4 is displayed on the display device 8, and when brought into contact with the R terminal, the voltage of the R terminal in relation to standard potential is displayed on the display device 8. As indicated in FIG. 2, assuming that the L terminal of the first power outlet A is connected to the neutral wire N of the single-phase 3-wire power line 10, and the R terminal is connected to the outer wire P1, 100 VAC is applied to the R terminal, and therefore, the voltage VR of the R terminal is displayed as a high potential difference compared to the voltage VL of the L terminal at nearly 0V. Consequently, the above operation demonstrates that the L terminal of the first power outlet is the ground terminal, and the R terminal is the hot terminal connected to either outer wire P1 or P2. However, it is not known whether the R terminal is connected to outer wire P1 or P2.

Continuing, with the ground probe terminal 3 remaining connected as the standard potential at near-ground potential, the hot probe terminal 2 is brought into contact with the R terminal of the first power outlet A that has been determined to be the hot terminal, and the voltage of the R terminal is continuously detected by the voltage detection circuit 4. Further, in the operation described above, the L terminal of the first power outlet A has been determined to be connected to the grounded neutral wire N, and therefore, in this operation, the L terminal may be taken as the ground potential body, and the ground probe terminal 3 may be brought into contact with this terminal.

The voltage VR of the R terminal that is continuously detected by the voltage detection circuit 4 is continuously output to the zero point detection circuit 6, and the rising zero cross point at which the voltage VR of the R terminal moves from negative to positive voltage is detected in the AC voltage cycles applied to the R terminal. In this state, the operator pushes the reset button 7, and when the reset signal is input to the zero cross point detection circuit 6, the timing signal is input into the CPU 5 at the time of the rising zero cross point first detected thereafter.

After activation, when the timing signal expressing the initial rising zero cross point is input from the zero cross point detection circuit 6, the CPU 5 stores the count value input from the free run counter 9 at that time into the RAM 11 as the first count value expressing the first zero cross time tA.

Once stored in the RAM 11 as the first count value, the CPU 5 treats this value as a completed detection operation in relation to the first power outlet A, and displays a message to this effect on the display device 8. The operator confirms this display, and carries the connection determination device 1 and the metal plate to near the second power outlet for determination of whether or not this second power outlet is connected to the same power line as the first power outlet A, and the same operations as those conducted in relation to the first power outlet A are repeated.

The second power outlets are connected to the power line 10 in any of the connection states of second power outlets B through E, which are connected in the four possible combinations of connecting the pair of L and R terminals to the neutral wire N and either of the outer wires P1 and P2.

Initially, the ground probe terminal 3 of the connection determination apparatus 1 is brought into contact with the horizontally supported metal plate, which is brought into contact with the floor or wall, etc, while being supported horizontally, and this is taken to be the standard potential of near-ground potential. In this state, the hot probe terminal 2 is alternately brought into contact with the pair of L and R terminals of the second power outlet, and the terminal which when contacted has a high potential difference displayed on the display device 8 is taken as the hot terminal. If a high potential difference is detected when the hot probe terminal 2 is brought into contact with the L terminal, then the connection state is either that of second power outlet C or D, and if a high potential difference is detected when the hot probe terminal 2 is brought into contact with the R terminal, then the connection state is either that of second power outlet B or E.

Continuing, with the ground probe terminal 3 remaining connected as the standard potential at near-ground potential, the hot probe terminal 2 is brought into contact with the identified hot terminal of the second power outlet, and the voltage of the hot terminal is continuously detected by the voltage detection circuit 4. Further, in the operation described above, the other terminal of the second power outlet has been determined to be connected to the grounded neutral wire N, and therefore, in this operation, the ground probe terminal 3 may be brought into contact with the identified ground terminal.

The voltage of the hot terminal that is continuously detected by the voltage detection circuit 4 (voltage VL for second power outlets C and D, voltage VR for second power outlets B and E) is continuously output to the zero point detection circuit 6, and the rising zero cross point at which the voltage moves from negative to positive is detected in the AC voltage cycles applied to the hot terminal. In this state, the operator pushes the reset button 7, and when the reset signal is input to the zero cross point detection circuit 6, the second timing signal is input into the CPU 5 at the time of the rising zero cross point first detected thereafter (tB, tC, tD, tE of FIG. 3).

After the initial timing signal is input, when the timing signal expressing the rising zero cross point is again input from the zero cross point detection circuit 6, the CPU 5 stores the count value input from the free run counter 9 at that time into the RAM 11 as the second count value expressing the second zero cross time.

When the second count value is stored in the RAM 11, the CPU 5 calculates the elapsed time ΔT from the first zero cross time to the second zero cross time by multiplying the count cycle of the free run counter 9 by the value derived by subtracting the first count value from the second count value. Then, this calculated time elapsed ΔT is compared with the cycle of the AC voltage running in the single-phase 3-wire power line 10, and if the elapsed time ΔT is an integral multiple of the AC voltage cycle, the connection between the power outlets is determined to be with the same power wire, and OK is displayed on the display device 8. If the time is not an integral multiple, the connection is determined to be with a different power wire, and NG is displayed.

For example, with the connection states indicated in FIG. 3, in-phase AC voltage is applied between the first power outlet A and the second power outlets B and C; therefore, the time elapsed ΔT, which is the difference between the first zero cross time tA and the second zero cross time tB or tC, is an integral multiple of the AC cycle, and when the detection operation is conducted on the second power outlets B and C, OK will be displayed on the display device 8. Meanwhile, reverse phase AC voltage is applied between the first power outlet A and the second power outlets D and E; therefore, the time elapsed ΔT, which is the difference between the first zero cross time tA and the second zero cross time tD or tE, is displaced a half cycle from an integral multiple of the AC cycle, and when the detection operation is conducted on the second power outlets D and E, NG will be displayed on the display device 8. These displays make known whether or not the second power outlet that has undergone the detection operation is connected to the same distribution line 10 as that of the first power outlet.

Unless the operation of the entire connection determination apparatus 4 is reset, when a timing signal is subsequently input from the zero cross point detection circuit 6, the CPU 5 will take the count value input from the free run counter 9 at that time as the count value expressing the second zero cross time, will simultaneously compare this with the first zero cross time, and will repeat the determination processing. Consequently, if an NG display is output as a result of the connection determination of a second power outlet for which the detection operation has been conducted, then the same detection operation can be repeated for another second power outlet without making any changes, and a second power outlet connected to the same distribution line 10 as that of the first power outlet can be sought out. Moreover, a second power outlet for which NG is displayed is clearly connected in reverse phase, and therefore, a signal power attenuation prevention means can be applied, such as connecting an out-of-phase coupler.

It is within the scope of the present invention to include all foreseeable equivalents to the elements and structures as described above with reference to FIGS. 1-3. For example, while the examples described above explain a single-phase 3-wire power line wired into a house, as long as the power is distributed by a single-phase 3-wire power line, the invention can be applied to determining the connection between power outlets distributed in differing locations in a commercial building or plant.

In addition, the elapsed time ΔT from the first zero cross time to the second zero cross time was calculated using the count value of a free run counter, but the absolute times of the first zero cross time to the second zero cross time may be detected, and that difference in time may be taken as the elapsed time ΔT. Moreover, the elapsed time ΔT does not always have to be directly calculated, and an emission means that repeatedly emits emission signals in the AC voltage cycle from the first zero cross time may be used, and it may be determined whether or not the elapsed time ΔT is an integral multiple of the AC voltage cycle by whether or not emission signals are emitted at the second zero cross time.

Moreover, in the examples described above, rising zero cross points when crossing the near-ground potential during the rise of potential of the hot probe terminal were taken to be the first and second zero cross times, but the falling zero cross points when crossing the near-ground potential during the fall of potential of the hot probe terminal may also be taken as the first and second zero cross times.

In addition, while the examples described above use as large a metal plate as possible for the ground potential body, to bring the metal plate into contact with the floor or wall, etc., and to position it nearby and parallel, if a large potential difference can be detected either between the L terminal or the R terminal, then the structure may be simplified, and it is not necessary to restrict the position and orientation of the arrangement.

What is claimed is:

1. A single-phase 3-wire power line connection determination apparatus comprising:
    a voltage detection circuit that detects a voltage between a ground probe terminal, which is brought into contact with a ground potential body and is at near-ground potential, and a hot probe terminal, which is brought into contact with either of a pair of terminals of a power outlet that is connected to a single-phase 3-wire power line, and that identifies the terminal at which a high potential difference has been detected as the hot terminal that is connected to either a first outer wire or a second outer wire of said single-phase 3-wire power line;
    a zero cross detection circuit that compares the potential of the AC voltage of the hot probe terminal contacting said hot terminal of the power outlet with a standard potential of the ground probe terminal at near-ground potential, and that detects a zero cross time at one of a rising zero cross point at which the AC voltage crosses the standard potential when rising and a falling zero cross point at which the AC voltage crosses the standard potential when falling;
    timing means that measures the elapsed time from a first zero cross time, which is detected when said hot probe terminal is brought into contact with said hot terminal of a first power outlet, to a second zero cross time, which is detected when said hot probe terminal is brought into contact with said hot terminal of a second power outlet; and
    a connection determination means that, if the elapsed time from said first zero cross time to said second zero cross time is an integral multiple of the cycle of said AC voltage, determines that said hot terminals of said first power outlet and said second power outlet are connected to a common first outer wire or second outer wire.

2. The single-phase 3-wire power line connection determination apparatus according to claim 1, wherein the ground potential body is a metal plate supported parallel to the ground surface.

3. The single-phase 3-wire power line connection determination apparatus according to claim 2, wherein the timing means is a clock timer that converts the difference in count values of a free run counter into said elapsed time.

4. The single-phase 3-wire power line connection determination apparatus according to claim 1, wherein the timing means is a clock timer that converts the difference in count values of a free run counter into said elapsed time.

5. A single-phase 3-wire power line connection determination method, comprising the steps of:
    bringing a ground probe terminal into contact with a ground potential body near a first power outlet connected to a single-phase 3-wire power line, and using a near ground potential at the ground potential body as the standard potential;
    detecting a voltage between said ground probe terminal taken as the standard potential and a hot probe terminal brought into contact with either of a pair of terminals of a first power outlet, wherein the terminal at which a high potential difference is detected is taken as the hot terminal of said first power outlet that is connected to a first outer wire or a second outer wire of said single-phase 3-wire power line, and said hot probe terminal is brought into contact with said hot terminal;
    comparing the potential of an AC voltage of said hot probe terminal contacting the hot terminal of said first power outlet with the standard potential of said ground probe terminal contacting the ground potential body, wherein a first zero cross time is detected either at the rising zero cross point at which the AC voltage crosses said standard potential when rising or at the falling zero cross point at which the AC voltage crosses said standard potential when falling;
    storing said first zero cross time;
    bringing said ground probe terminal into contact with the ground potential body near a second power outlet that is connected to said single-phase 3-wire power line, wherein near ground potential is taken as the standard potential;
    detecting a voltage between said ground probe terminal taken as the standard potential and said hot probe terminal brought into contact with either of a pair of terminals of said second power outlet is detected, wherein the terminal at which a high potential difference is taken as the hot terminal of said second power outlet that is connected to a first outer wire or a second outer wire of said single-phase 3-wire power line;
    bringing said hot probe terminal into contact with said hot terminal;
    comparing the potential of the AC voltage of said hot probe terminal contacting the hot terminal of said second power outlet with the standard potential of said ground probe terminal contacting said ground potential body, wherein a second zero cross time is detected at which the potential of said AC voltage crosses the standard potential at the same rising zero cross point or falling zero cross point as that of said first zero cross point; and if the time elapsed from said first zero cross to said second zero cross is an integral multiple of the cycle of said AC voltage, determining that said hot terminals of said first power outlet and said second power outlet are connected to a common first outer wire or second outer wire.

6. The single-phase 3-wire power line connection determination method according to claim 5, wherein the ground potential body is a metal plate supported parallel to the ground surface.

* * * * *